(12) United States Patent
Hsieh

(10) Patent No.: US 11,127,763 B2
(45) Date of Patent: Sep. 21, 2021

(54) DISPLAY PANEL AND MANUFACTURING METHOD THEREOF AND DISPLAY DEVICE

(71) Applicant: BOE Technology Group Co., Ltd., Beijing (CN)

(72) Inventor: Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/640,801

(22) PCT Filed: Jul. 23, 2019

(86) PCT No.: PCT/CN2019/097365
§ 371 (c)(1),
(2) Date: Feb. 21, 2020

(87) PCT Pub. No.: WO2020/020186
PCT Pub. Date: Jan. 30, 2020

(65) Prior Publication Data
US 2021/0118909 A1 Apr. 22, 2021

(30) Foreign Application Priority Data

Jul. 24, 2018 (CN) .......................... 201810819474.7

(51) Int. Cl.
*H04M 1/00* (2006.01)
*H01L 27/12* (2006.01)
(Continued)

(52) U.S. Cl.
CPC ........ *H01L 27/124* (2013.01); *H01L 27/1262* (2013.01); *H01L 29/78633* (2013.01);
(Continued)

(58) Field of Classification Search
CPC ............... H01L 27/124; H01L 27/1262; H01L 29/78633; H01L 27/3272; H01L 27/3276;
(Continued)

(56) References Cited

U.S. PATENT DOCUMENTS 6,078,372 A * 6/2000 Kim .................. G02F 1/133526
349/106
6,528,824 B2 * 3/2003 Yamagata ........... H01L 51/5262
257/448
(Continued)

FOREIGN PATENT DOCUMENTS

CN 105572998 A 5/2016
CN 106249952 A 12/2016
(Continued)

OTHER PUBLICATIONS

First office action of Chinese application No. 201810819474.7 dated Sep. 25, 2019.
(Continued)

*Primary Examiner* — April G Gonzales
(74) *Attorney, Agent, or Firm* — Fay Sharpe LLP (57) ABSTRACT

A display panel and a manufacturing method thereof, and a display device is provided. The display panel includes a base substrate, and a light-shielding layer and a plurality of wires which are sequentially located on the base substrate in a direction away from the base substrate. The light-shielding layer includes a plurality of light-shielding structures. The display panel has a transparent display region. Orthographic projections of at least two wires located on the transparent display region on the base substrate are located within an orthographic projection of one light-shielding structure on the base substrate. The one light-shielding structure is configured to shield external light which is emitted to the at least two wires through the base substrate. It is conducive to
(Continued)

reducing the influence of external light on the display effect of the display panel.

18 Claims, 4 Drawing Sheets

(51) Int. Cl.
   *H01L 29/786*     (2006.01)
   *H04B 1/3888*     (2015.01)
   *H04M 1/02*       (2006.01)
   *G02F 1/1362*     (2006.01)
   *G02F 1/1368*     (2006.01)
   *H01L 27/32*      (2006.01)

(52) U.S. Cl.
   CPC ........ *H04B 1/3888* (2013.01); *H04M 1/0264* (2013.01); *H04M 1/0266* (2013.01); *G02F 1/1368* (2013.01); *G02F 1/136209* (2013.01); *H01L 27/3272* (2013.01); *H01L 27/3276* (2013.01)

(58) Field of Classification Search
   CPC ............... H04B 1/3888; H04M 1/0266; G02F 1/136209; G02F 1/1368
   USPC ...................................... 455/575.8
   See application file for complete search history.

(56) References Cited

U.S. PATENT DOCUMENTS

| | | | |
|---|---|---|---|
| 9,553,135 B2* | 1/2017 | Hsieh | H01L 27/1244 |
| 9,577,202 B2* | 2/2017 | Hsieh | H01L 51/56 |
| 2015/0187800 A1* | 7/2015 | Park | H01L 27/1225 |
| | | | 349/43 |
| 2015/0316814 A1* | 11/2015 | Nishiki | G02F 1/133615 |
| | | | 349/42 |
| 2016/0254329 A1* | 9/2016 | Hsieh | H01L 27/3244 |
| | | | 257/72 |
| 2017/0133411 A1* | 5/2017 | Xie | H01L 23/544 |
| 2018/0364530 A1* | 12/2018 | Wang | G02F 1/136209 |

FOREIGN PATENT DOCUMENTS

| | | |
|---|---|---|
| CN | 107071244 A | 8/2017 |
| CN | 107425040 A | 12/2017 |
| CN | 107845666 A | 3/2018 |
| CN | 107948421 A | 4/2018 |
| CN | 207338380 U | 5/2018 |
| CN | 108682299 A | 10/2018 |

OTHER PUBLICATIONS

International Search Report from PCT/CN2019/097365 dated Oct. 21, 2019.

* cited by examiner

DISPLAY PANEL AND MANUFACTURING METHOD THEREOF AND DISPLAY DEVICE

The present disclosure is a 371 of PCT Application No. PCT/CN2019/097365 filed on Jul. 23, 2019, which claims priority of Chinese Patent Application No. 201810819474.7, filed on Jul. 24, 2018 and titled "Display Panel and Manufacturing Method Thereof, and Display Device", which is incorporated herein by reference in its entirety.

TECHNICAL FIELD

The present disclosure relates to a display panel and a manufacturing method thereof, and a display device.

BACKGROUND

A mobile terminal such as a mobile phone often includes a display panel and a camera. With the advancement of technology, a mobile terminal has a constantly increasing screen-to-body ratio and develops towards a full screen. The screen-to-body ratio refers to a ratio of the area of a display region of the display panel to the area of the front surface of the mobile terminal.

SUMMARY

The present disclosure provides a display panel and a manufacturing method thereof, and a display device. The technical solutions are as follows:

In one aspect, a display panel is provided, including:
a base substrate, and a light-shielding layer and a plurality of wires which are sequentially located on the base substrate in a direction away from the base substrate, wherein the light-shielding layer includes a plurality of light-shielding structures; the display panel has a transparent display region; orthographic projections of at least two wires located on the transparent display region on the base substrate are located within an orthographic projection of one light-shielding structure on the base substrate; and the one light-shielding structure is configured to shield external light which is emitted to the at least two wires through the base substrate.

Optionally, the one light-shielding structure and the at least two wires are identical in shape and extending direction.

Optionally, a ratio of a width of the first light-shielding structure to a first spacing is less than 7.5/16.125, and a sum of the width of the first light-shielding structure and the first spacing is greater than 94.5 microns; the first light-shielding structure is any one of the plurality of light-shielding structures; the first spacing is a distance between the second light-shielding structure and the first light-shielding structure; and the second light-shielding structure is adjacent to the first light-shielding structure.

Optionally, the ratio of the width of the first light-shielding structure to the first spacing is 7/16, and the sum of the width of the first light-shielding structure and the first spacing is 115 microns.

Optionally, orthographic projections of the plurality of wires on the base substrate are located within orthographic projections of the plurality of light-shielding structures on the base substrate.

Optionally, the display panel is a partially transparent display panel.

Optionally, the display panel is a full-screen transparent display panel.

Optionally, the display panel further includes a protective layer located between the light-shielding layer and the plurality of wires.

Optionally, a material of the light-shielding layer includes metal.

Optionally, the display panel further includes a protective substrate distributed opposite to the base substrate, and the light-shielding layer is located between the base substrate and the protective substrate.

Optionally, the display panel includes a plurality of pixel regions, and wires are arranged between at least two adjacent pixel regions; the pixel region is provided with a pixel unit; the pixel unit includes a gate electrode, a gate insulating layer, an active layer, a source electrode, a drain electrode, a passivation layer and a pixel electrode, wherein the source electrode and the drain electrode are in contact with the active layer respectively, and the pixel electrode is in contact with the drain electrode.

Optionally, the display panel is a partially transparent display panel, the display panel includes a plurality of pixel regions, and wires are arranged between at least two adjacent pixel regions; the pixel region is provided with a pixel unit; the pixel unit includes a gate electrode, a gate insulating layer, an active layer, a source electrode, a drain electrode, a passivation layer and a pixel electrode, wherein the source electrode and the drain electrode are in contact with the active layer respectively, and the pixel electrode is in contact with the drain electrode;

orthographic projections of the plurality of wires on the base substrate are located within orthographic projections of the plurality of light-shielding structures on the base substrate, the one light-shielding structure and the at least two wires are identical in shape and extending direction, a ratio of a width of the first light-shielding structure to the first spacing is 7/16, a sum of the width of the first light-shielding structure and the first spacing is 115 microns, the first light-shielding structure is any one of the plurality of light-shielding structures, the first spacing is a distance between the second light-shielding structure and the first light-shielding structure and the second light-shielding structure is adjacent to the first light-shielding structure; and the display panel further includes: a protective layer located between the light-shielding layer and the plurality of wires and a protective substrate distributed opposite to the base substrate, the light-shielding layer is located between the base substrate and the protective substrate, and a material of the light-shielding layer includes metal.

In another aspect, a manufacturing method of a display panel is provided, including the following steps:

forming a light-shielding layer on a base substrate, the light-shielding layer including a plurality of light-shielding structures; and forming a plurality of wires on the base substrate on which the light-shielding layer is formed, wherein the display panel has a transparent display region; orthographic projections of at least two wires located on the transparent display region on the base substrate are located within an orthographic projection of one light-shielding structure on the base substrate; and the one light-shielding structure is configured to shield external light which is emitted to the at least two wires through the base substrate.

Optionally, the one light-shielding structure and the at least two wires are identical in shape and extending direction.

Optionally, a ratio of a width of the first light-shielding structure to a first spacing is less than 7.5/16.125, and a sum of the width of the first light-shielding structure and the first spacing is greater than 94.5 microns; the first light-shielding structure is any one of the plurality of light-shielding structures; the first spacing is a distance between the second light-shielding structure and the first light-shielding structure; and the second light-shielding structure is adjacent to the first light-shielding structure.

Optionally, the ratio of the width of the first light-shielding structure to the first spacing is 7/16, and the sum of the width of the first light-shielding structure and the first spacing is 115 microns.

Optionally, orthographic projections of the plurality of wires located on the base substrate are located within orthographic projections of the plurality of light-shielding structures on the base substrate.

Optionally, the display panel is a partially transparent display panel.

Optionally, the display panel is a full-screen transparent display panel.

Optionally, after forming the light-shielding layer on the base substrate, further including:

forming a protective layer on the base substrate on which the light-shielding layer is formed, wherein the forming a plurality of wires on a base substrate on which the light-shielding layer is formed includes:

forming a plurality of wires on the base substrate on which the protective layer is formed.

Optionally, the forming a light-shielding layer on a base substrate includes:

forming a light-shielding layer on the base substrate by using metal.

Optionally, the method further includes: arranging the protective substrate opposite to the base substrate, the light-shielding layer being located between the base substrate and the protective substrate.

Optionally, the display panel includes a plurality of pixel regions, and wires are arranged between at least two adjacent pixel regions; the method further includes: forming pixel units in the pixel region, wherein the pixel unit includes a gate electrode, a gate insulating layer, an active layer, a source electrode, a drain electrode, a passivation layer, and a pixel electrode, wherein the source electrode and the drain electrode are in contact with the active layer respectively, and the pixel electrode is in contact with the drain electrode.

In yet another aspect, there is provided a display device which includes a display panel.

The display panel includes:

a base substrate, and a light-shielding layer and a plurality of wires which are sequentially located on the base substrate in a direction away from the base substrate; and the light-shielding layer includes a plurality of light-shielding structures; the display panel has a transparent display region; orthographic projections of at least two wires located on the transparent display region on the base substrate are located within an orthographic projection of one light-shielding structure on the base substrate; and the one light-shielding structure is configured to shield external light which is emitted to the at least two wires through the base substrate.

Optionally, the one light-shielding structure and the at least two wires are identical in shape and extending direction.

Optionally, a ratio of a width of the first light-shielding structure to a first spacing is less than 7.5/16.125, and a sum of the width of the first light-shielding structure and the first spacing is greater than 94.5 microns; the first light-shielding structure is any one of the plurality of light-shielding structures; the first spacing is a distance between the second light-shielding structure and the first light-shielding structure; and the second light-shielding structure is adjacent to the first light-shielding structure.

Optionally, the ratio of the width of the first light-shielding structure to the first spacing is 7/16, and the sum of the width of the first light-shielding structure and the first spacing is 115 microns.

Optionally, orthographic projections of the plurality of wires located on the base substrate are located within orthographic projections of the plurality of light-shielding structures on the base substrate.

Optionally, the display panel is a partially transparent display panel.

Optionally, the display panel is a full-screen transparent display panel.

Optionally, the display panel further includes a protective layer located between the light-shielding layer and the plurality of wires.

Optionally, a material of the light-shielding layer includes metal.

Optionally, the display panel further includes a protective substrate distributed opposite to the base substrate, and the light-shielding layer is located between the base substrate and the protective substrate.

Optionally, the display panel includes a plurality of pixel regions, and wires are arranged between at least two adjacent pixel regions; the pixel region is provided with a pixel unit; the pixel unit includes a gate electrode, a gate insulating layer, an active layer, a source electrode, a drain electrode, a passivation layer and a pixel electrode, wherein the source electrode and the drain electrode are in contact with the active layer respectively, and the pixel electrode is in contact with the drain electrode.

Optionally, the display panel is a partially transparent display panel, the display panel includes a plurality of pixel regions, and wires are arranged between at least two adjacent pixel regions; the pixel region is provided with a pixel unit; the pixel unit includes a gate electrode, a gate insulating layer, an active layer, a source electrode, a drain electrode, a passivation layer and a pixel electrode, wherein the source electrode and the drain electrode are in contact with the active layer respectively, and the pixel electrode is in contact with the drain electrode;

orthographic projections of the plurality of wires on the base substrate are located within orthographic projections of the plurality of light-shielding structures on the base substrate, the one light-shielding structure and the at least two wires are identical in shape and extending direction, a ratio of a width of the first light-shielding structure to the first spacing is 7/16, a sum of the width of the first light-shielding structure and the first spacing is 115 microns, the first light-shielding structure is any one of the plurality of light-shielding structures, the first spacing is a distance between the second light-shielding structure and the first light-shielding structure and the second light-shielding structure is adjacent to the first light-shielding structure; and the display panel further includes: a protective layer located between the light-shielding layer and the plurality of wires and a protective substrate distributed opposite to the base substrate, the light-shielding layer is located between the base substrate and the protective substrate, and a material of the light-shielding layer includes metal.

Optionally, the display device is a mobile terminal which includes a camera; the display panel has a transparent display region and a non-transparent display region; the camera is located on a non-display side of the display panel;

and an orthographic projection of the camera on the display panel is located in the transparent display region.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The present disclosure will be described in detail with reference to the accompanying drawings, to present the principle, technical solutions, and advantages of the present disclosure more clearly.

Figure 1:
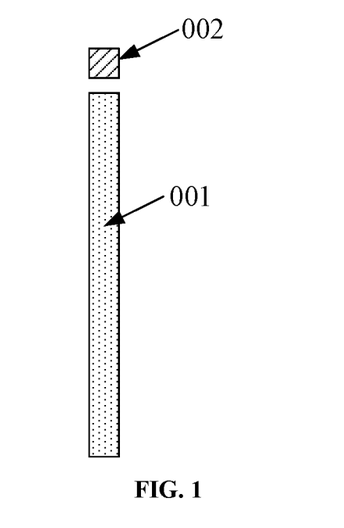
FIG. 1 is a schematic diagram of a mobile terminal known by the inventors.
Figure 2:
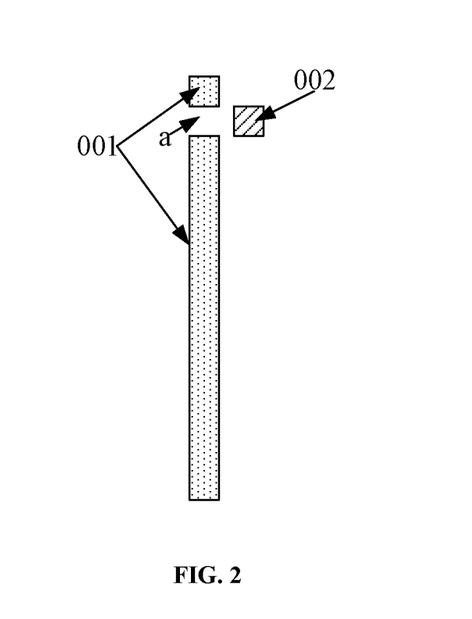
FIG. 2 is a schematic diagram of another mobile terminal known by the inventors.
Figure 3:
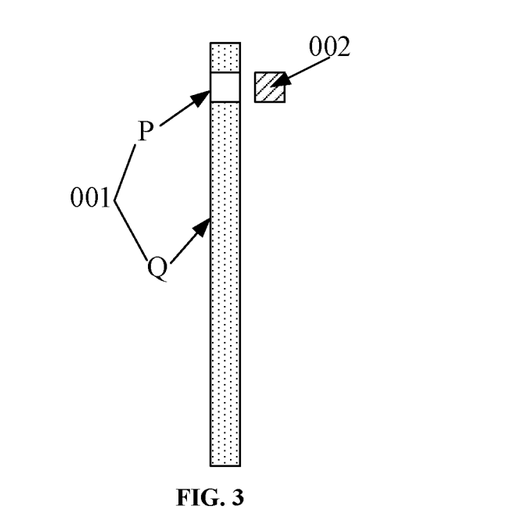
FIG. 3 is a schematic diagram of yet another mobile terminal known by the inventors.

A mobile terminal generally includes a display panel and a camera. The display panel is configured to display information. The camera is configured to capture images (such as shooting photos and videos). FIGS. 1 to 3 illustrate three kinds of mobile terminals known by the inventors.

As shown in FIG. 1, a camera 002 is located on the top of a display panel 001, and is located in the same plane as the display panel 001. However, in a mobile terminal in FIG. 1, the camera 002 needs to occupy the area of the front surface of the mobile terminal, and the screen-to-body of the mobile terminal is relatively low.

As shown in FIG. 2, a through hole a is formed in the display panel 001. The camera 002 is located on a non-display side (not shown in FIG. 2) of the display panel 001, and an orthographic projection of the camera 002 on the display panel 001 is located in the through hole a. The camera 002 may capture an image on a display side (not shown in FIG. 2) of the display panel 001 via the through hole a, thereby achieving a photographing function. Compared with the mobile terminal shown in FIG. 1, a mobile terminal shown in FIG. 2 has a relative large screen-to-body ratio. However, since the through hole a is formed in the display panel 001, it is difficult to set an area of a display region of the display panel 001 to be equal to an area of the front surface of the mobile terminal, and it is also difficult for the mobile terminal to realize a full-screen display.

As shown in FIG. 3, the display panel 001 has a transparent display region P and a non-transparent display region Q. The camera 002 is located on the non-display side (not shown in FIG. 3) of the display panel 001, and the orthographic projection of the camera 002 on the display panel 001 is located in the transparent display region P. The camera 002 may capture an image on the display side (not shown in FIG. 3) of the display panel 001 through the transparent display region P to achieve a photographing function. Each of the transparent display region P and the non-transparent display region Q has pixel units (not shown in FIG. 3) and wires (also referred to as signal lines, such as grid lines and data lines, which are not shown in FIG. 3). The wires are respectively connected to the pixel units and a driver (not shown in FIG. 3) of the display panel 001. The driver may apply a display signal to the pixel units through the wires, so that the display panel 001 can achieve image display. It is easily understood that in the display panel 001 shown in FIG. 3, both the transparent display region P and the non-transparent display region Q can display images, and the camera 002 is located on the non-display side of the display panel 001. Therefore, the area of the display region of the display panel 001 may be equal to the area of the front surface of the mobile terminal, and the mobile terminal can achieve a full-screen display. However, in the mobile terminal shown in the FIG. 3, external light can be emitted into the transparent display region P. When the external light passes through the transparent display region P, if the wires of the transparent display region P are relatively dense, the external light is likely to be diffracted among the wires, which affects the optical imaging of the display panel 001, thereby affecting the display effect of the display panel 001 and the photographing effect of the camera 002.

In the solution provided by the embodiment of the present disclosure, a light-shielding layer and a plurality of wires are arranged in the display panel. The light-shielding layer can shield the external light and prevent the external light from irradiating the wires, thereby reducing the diffraction of the external light among the wires and reducing the influence of the external light on the display effect of the display panel. When the display panel is applied to a mobile terminal, the light-shielding layer may also achieve a full-screen display of the mobile terminal, and can reduce the influence of the external light on the photographing effect of the camera. The solutions provided by the embodiments of the present disclosure may refer to the following embodiments.

Figure 4:
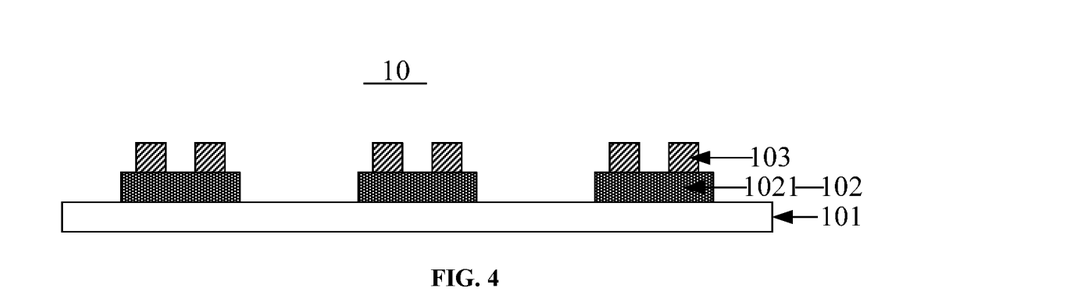
FIG. 4 is a schematic structural diagram of a display panel as provided by an embodiment of the present disclosure.

FIG. 4 illustrates a schematic structural diagram of a display panel 10 as provided by an embodiment of the present disclosure. Referring to FIG. 4, the display panel 10 includes a base substrate 101, and a light-shielding layer 102 and a plurality of wires 103 which are sequentially located on the base substrate 101 in a direction away from the base substrate 101. The light-shielding layer 102 includes a plurality of light-shielding structures 1021. The display panel 10 has a transparent display region (not shown in FIG. 4). Orthographic projections of at least two wires 103 located on the transparent display region among the plurality of wires 103 on the base substrate 101 are located within an orthographic projection of one light-shielding structure 1021 on the base substrate 101. The one light-shielding structure 1021 is configured to shield external light which is which is emitted to the at least two wires 103 through the base substrate 101.

In the embodiment of the present disclosure, one light-shielding structure 1021 can shield external light emitted to at least two wires 103. In this way, the external light will not be emitted into the space between at least two wires 103 shielded by the one light-shielding structure 1021, so that optical diffraction will not occur between at least two wires 103 shielded by one light-shielding structure 1021. Therefore, the diffraction of the external light among the wires can be reduced. Exemplarily, as shown in FIG. 4, orthographic projections of every two wires 103 on the base substrate 101 are located within an orthographic projection of one light-shielding structure 1021 on the base substrate 101. Each light-shielding structure 1021 can shield the external light which is emitted to the two wires 103 through the base substrate 101.

In summary, according to the display panel provided by the embodiment of the present disclosure, the light-shielding layer and a plurality of wires are arranged on the base substrate in the display panel, and includes a plurality of light-shielding structures, and the orthographic projections of at least two of the plurality of wires on the base substrate are located within the orthographic projection of one light-shielding structure on the base substrate. Therefore, the light-shielding structures can shield the external light which is emitted to at least two wires through the base substrate, and reduce the diffraction of the external light among the wires, thereby reducing the influence of the external light on the display effect of the display panel.

Optionally, one light-shielding structure 1021 and at least two wires 103 are identical in shape and extending direction. That is, each light-shielding structure 1021 can shield at least two wires 103.

Optionally, the display panel 10 may be a partially transparent display panel, so that the display panel 10 has a transparent display region. Alternatively, the display panel 10 may be a full-screen transparent display panel, so that the display panel 10 has a transparent display region. The partially transparent display panel has a transparent display region and a non-transparent display region, and the full-screen transparent display panel has a transparent display region and does not have a non-transparent display region.

Optionally, in an embodiment of the present disclosure, orthographic projections of the plurality of wires 103 on the base substrate 101 may be located within orthographic projections of the plurality of light-shielding structures 1021 on the base substrate 101. That is, the orthographic projections of all the wires 103 on the base substrate 101 are located within the orthographic projections of all the light-shielding structures 1021 on the base substrate 101. In this case, one light-shielding structure 1021 can shield external light emitted to at least two wires 103, and the plurality of light-shielding structures 1021 can shield external light emitted to the plurality of wires 103. Therefore, the plurality of light-shielding structures 1021 can shield the external light better and minimize the diffraction of the external light among the wires.

Optionally, in an embodiment of the present disclosure, the display panel includes a plurality of pixel regions. The wires 103 are arranged between at least two adjacent pixel regions. The wires 103 may include a plurality of gate lines and a plurality of data lines. The plurality of gate lines may be parallel, the plurality of data lines may be parallel, and the gate lines and data lines are insulated and intersected. The plurality of gate lines and the plurality of data lines are insulated and intersected to define a plurality of pixel regions arranged in an array. Each pixel region is surrounded by two adjacent gate lines and two adjacent data lines. In the display panel 10, each pixel region includes pixel units (not shown in FIG. 4). Each pixel unit may include a gate electrode, a gate insulating layer, an active layer, a source electrode, a drain electrode, a passivation layer, and a pixel electrode. The gate electrode, the gate insulating layer, the active layer, the source electrode and the drain electrode constitute a TFT (Thin Film Transistor). The TFT, as a switch of the pixel unit, is configured to control the pixel unit to be turned on and off. The TFT may be a top-gate TFT or a bottom-gate TFT. In some implementation scenarios, the pixel unit is also called a display unit. In addition, the pixel unit further includes other structures. For example, when the display panel is a liquid crystal display panel, the pixel unit may further include a common electrode, liquid crystals and the like; and when the display panel is an electroluminescence display panel, the pixel unit may further include an electroluminescent layer, a cathode, and the like. The electroluminescent display panel may be an OLED (Organic Light Emitting Diode) display panel or a QLED (Quantum Dot Light Emitting Diodes) display panel, and will not be limited in the embodiments of the present disclosure.

Figure 5:
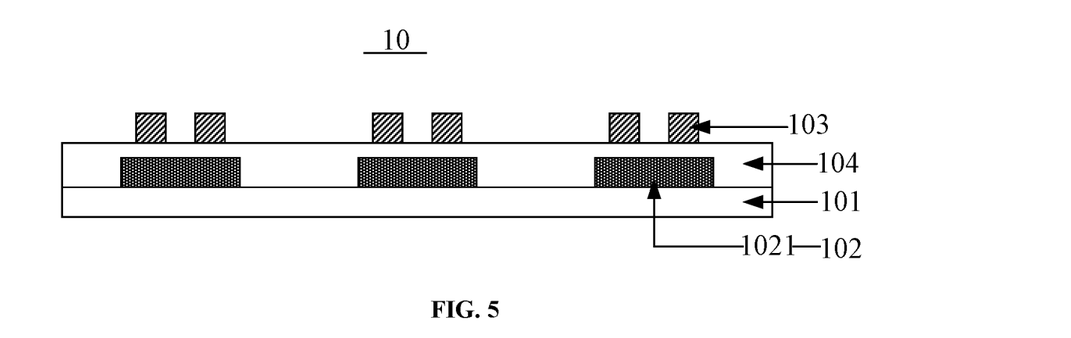
FIG. 5. is a schematic structural diagram of another display panel as provided by an embodiment of the present disclosure.

Optionally, FIG. 5 illustrates a schematic structural diagram of another display panel 10 as provided by an embodiment of the present disclosure. Referring to FIG. 5, based on FIG. 4, the display panel 10 further includes a protective layer 104 which is located between the light-shielding layer 102 and the plurality of wires 103. That is, the light-shielding layer 102 is located on the base substrate 101, the protective layer 104 is located on one side of the light-shielding layer 102 away from the base substrate 101, and the plurality of wires 103 are located on the protective layer 104. The material of the protective layer 104 may be a transparent insulating material. In some implementation scenarios, the protective layer 104 may also be referred to as an insulating layer. For example, the material of the protective layer 104 may be $SiO_2$ (silicon dioxide), $SiO_x$ (silicon oxide), $SiN_x$ (silicon nitride), $Al_2O_3$ (alumina), or $SiO_xN_x$ (silicon oxynitride). In the embodiment of the present disclosure, material of the light-shielding layer 102 includes a metal. For example, the material of the light-shielding layer 102 may be one or an alloy of more of metal Mo (molybdenum), metal Cu (copper), or metal Al (aluminum). Since the wires 103 are also generally made of metal, the protective layer 104 arranged between the light-shielding layer 102 and the plurality of wires 103 can prevent the light-shielding layer 102 from affecting display signals on the wires 103 and ensure the normal operation of the display panel 10. Optionally, the light-shielding layer 102 may also be formed of an insulating material, as long as it can shield external light. When the light-shielding layer 102 is formed of an insulating material, the protection layer 104 may be provided or may be not, which will not be limited in the embodiment of the present disclosure.

Figure 6:
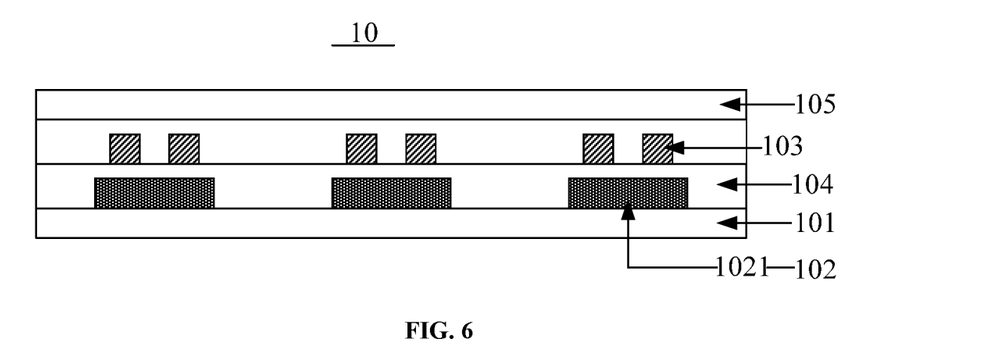
FIG. 6. is a schematic structural diagram of yet another display panel as provided by an embodiment of the present disclosure.

Optionally, FIG. 6 is a schematic structural diagram of yet another display panel 10 as provided by an embodiment of the present disclosure. As shown in FIG. 6, based on FIG. 5, the display panel 10 further includes a protective substrate 105 that is distributed opposite to the base substrate 101. The light-shielding layer 102, the protective layer 104, the wires 103, and the pixel units (not shown in FIG. 6) are all located between the base substrate 101 and the protective substrate 105. Both the base substrate 101 and the protective substrate 105 may be transparent substrates, for example, substrates made of non-metallic materials which have a certain sturdiness and light transmittance, such as glass, quartz, transparent resin and the like. Alternatively, both the base substrate 101 and the protective substrate 105 may be flexible transparent substrates made of PI (Polyimide). The protective substrate 105 may be configured to protect internal structures (such as the pixel units, the light-shielding layer, or the wires) of the display panel 10, thereby ensuring the integrity of the display panel 10.

Figure 7:
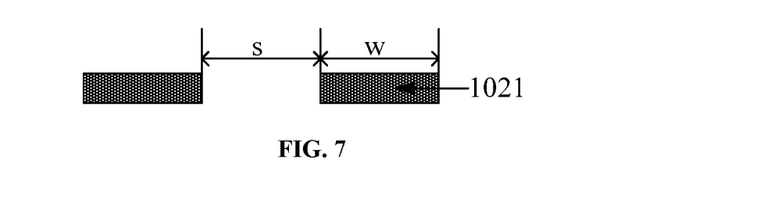
FIG. 7 is a schematic diagram showing a width of each light-shielding structure and a spacing between light-shielding structures as provided by an embodiment of the present disclosure.

Optionally, in the embodiment of the present embodiment, a ratio of a width of the first light-shielding structure to the first spacing is less than 7.5/16.125, and the sum of the width of the first light-shielding structure and the first spacing is greater than 94.5 microns. The first light-shielding structure is any one of the plurality of light-shielding structures 1021. The first spacing is a distance between the second light-shielding structure and the first light-shielding structure, and the second light-shielding structure is adjacent to the first light-shielding structure. Exemplarily, as shown in FIG. 7, if the width of the first light-shielding structure 1021 is w and the first spacing is s, then w/s<7.5/16.125, and w+s>94.5 microns. Optionally, w/s is approximately equal to 7/16, and w+s is approximately equal to 115 microns. Optionally, w/s may be equal to 7/16, or the difference between w/s and 7/16 is less than a certain threshold (such as a threshold of 0.1 or 0.2); w+s may be equal to 115 microns, or the difference between w+s and 115 microns is less than a certain threshold (such as a threshold of 0.1 or 0.2). In the embodiment of the present disclosure, w/s<7.5/16.125, and w+s>94.5 microns. On the premise that the width of the light-shielding structure 1021 is as small as possible, one light-shielding structure 1021 can be allowed to shield as many wires 103 as possible. Since the width of the light-shielding structure 1021 is as small as possible, the light transmittance of the display panel 10 can be ensured. Since the wires 103 shielded by one light-shielding structure 1021 are as many as possible, the optical diffraction can be reduced as much as possible. Therefore, w/s<7.5/16.125 and w+s>94.5 microns can ensure the light transmittance of the display panel 10 while reducing the optical diffraction as much as possible and facilitate the production of the wires 103.

In summary, according to the display panel provided by the embodiment of the present disclosure, the light-shielding layer and a plurality of wires are arranged on the base substrate in the display panel, and includes a plurality of light-shielding structures, and the orthographic projections of at least two of the plurality of wires on the base substrate are located within the orthographic projection of one light-shielding structure on the base substrate. Therefore, the light-shielding structures can shield the external light which is emitted to at least two wires through the base substrate, and reduce the diffraction of the external light among the wires, thereby reducing the influence of the external light on the display effect of the display panel.

The display panel provided in the embodiment of the present disclosure may be applied to the following method. A manufacturing method and a manufacturing principle of the display panel in the embodiment of the present disclosure may refer to the descriptions in the embodiments below.

Figure 8:
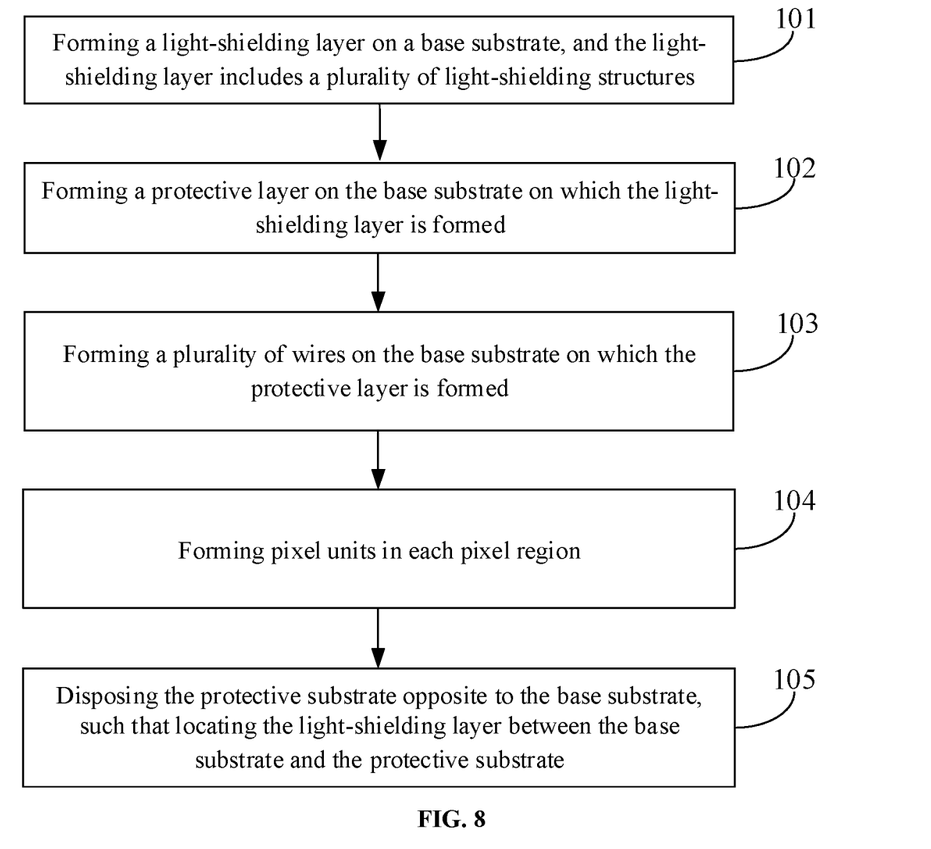
FIG. 8 is a flowchart of a manufacturing method of the display panel as provided by an embodiment of the present disclosure.

FIG. 8 is a flowchart of a manufacturing method of a display panel as provided by an embodiment of the present disclosure. The manufacturing method of the display panel may be used to manufacture the display panel shown in any one of FIGS. 4 to 6. This embodiment will be described by taking the display panel shown in FIG. 6 as an example. Referring to FIG. 8, the method includes the following steps.

Figure 9:
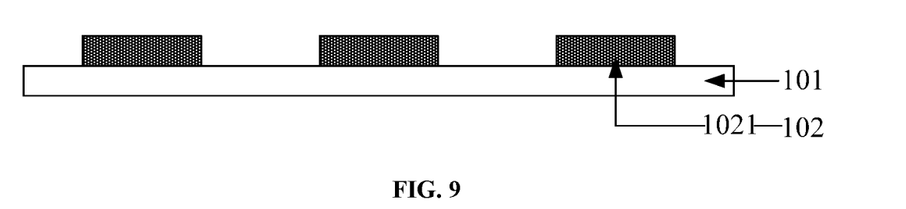
FIG. 9 is a schematic diagram after a light-shielding layer is formed on a base substrate as provided by an embodiment of the present disclosure.

In Step 101, a light-shielding layer is formed on a base substrate, and the light-shielding layer includes a plurality of light-shielding structures.

A reference is made to FIG. 9, which is a schematic diagram after the light-shielding layer 102 is formed on the base substrate 101 as provided by the embodiment of the present disclosure. As shown in FIG. 9, the light-shielding layer 102 includes a plurality of light-shielding structures 1021. A ratio of a width of the first light-shielding structure to a first spacing is less than 7.5/16.125, and the sum of the width of the first light-shielding structure and the first spacing is greater than 94.5 micrometers. The first light-shielding structure is any one of the plurality of light-shielding structures 1021. The first spacing is a distance between the second light-shielding structure and the first light-shielding structure, and the second light-shielding structure is adjacent to the first light-shielding structure. In the embodiment of the present disclosure, the light-shielding layer 102 may be made of metal.

Exemplarily, a layer of metal material may be deposited on the base substrate 101 by using one of magnetron sputtering, thermal evaporation, PECVD (Plasma Enhanced Chemical Vapor Deposition) or the like to obtain a metal material layer. Then, the metal material layer is processed by a single patterning process to obtain the light-shielding layer 102.

Figure 10:
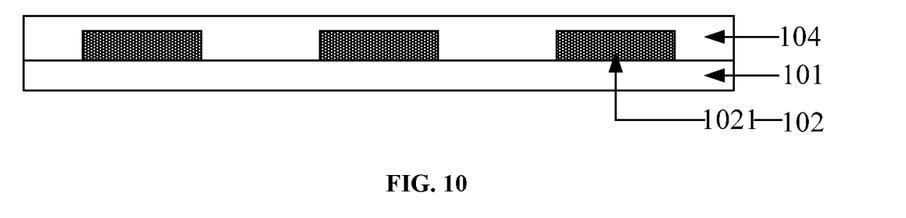
FIG. 10 is a schematic diagram after a protective layer is formed on a base substrate on which a light-shielding layer is formed as provided by an embodiment of the present disclosure.

In Step 102, a protective layer is formed on the base substrate on which the light-shielding layer is formed.

A reference is made to FIG. 10, which is a schematic diagram after a protective layer 104 is formed on the base substrate 101 on which the light-shielding layer 102 is formed as provided by an embodiment of the present disclosure. As shown in FIG. 10, the protective layer 104 covers the light-shielding layer 102. The material of the protective layer 104 may be a transparent insulating material. For example, the material of the protective layer 104 may be one or a combination of more of $SiO_2$, $SiO_x$, $SiN_x$, $Al_2O_3$ or $SiO_xN_x$.

Exemplarily, a layer of SiOx may be deposited on the base substrate 101 on which the light-shielding layer 102 is formed by using one of coating, magnetron sputtering, thermal evaporation or PECVD to form a SiOx layer. Then, the SiOx layer is baked to form the protective layer 104. Optionally, when the protective layer 104 includes a pattern, the SiOx layer may further be patterned. For example, a SiOx layer is patterned by the single patterning process, which will not be limited in the embodiment of the present disclosure.

In Step 103, a plurality of wires is formed on the base substrate on which the protective layer is formed.

A schematic diagram after the plurality of wires 103 is formed on the base substrate 101 on which the protective layer 104 is formed may refer to FIG. 5. The display panel includes a plurality of pixel regions. The wires 103 are arranged between at least two adjacent pixel regions. Orthographic projections of at least two of the plurality of wires 103 on the base substrate 101 are located within an orthographic projection of one light-shielding structure on the base substrate 101. The one light-shielding structure is configured to shield external light which is emitted to the at least two wires 103 through the base substrate 101. Optionally, the display panel has a transparent display region. Orthographic protections of at least two wires 103 in the transparent display region on the base substrate 101 are located within an orthographic projection of one light-shielding structure 1021 on the base substrate 101. The one light-shielding structure 1021 is configured to shield external light which is emitted to the at least two wires 103 through the base substrate 101. Orthographic projections of the plurality of wires 103 on the base substrate 101 may be located within the orthographic projections of the plurality of light-shielding structures 1021 on the base substrate 101. In the embodiment of the present disclosure, the wires 103 may be made of metal.

Exemplarily, a layer of metal material may be deposited on the base substrate 101 on which the protective layer 104 is formed by using one of magnetron sputtering, thermal evaporation or PECVD to obtain a metal material layer. Then, the metal material layer is processed by the single patterning process to obtain the plurality of wires 103.

In Step 104, pixel units are formed in each pixel region.

Each pixel unit may include a gate electrode, a gate insulating layer, an active layer, a source electrode, a drain electrode, a passivation layer, and a pixel electrode. The source electrode and the drain electrode are respectively in contact with the active layer. The pixel electrode is in contact with the drain electrode. The gate electrode, the gate insulating layer, the active layer, the source electrode and the drain electrode constitute a TFT. The TFT, as a switch of the pixel unit, is configured to control the pixel unit to be turned on and off. The TFT may be a top-gate TFT or a bottom-gate TFT.

Exemplarily, the embodiment of the present disclosure will be described by taking that the TFT may be a bottom-gate TFT as an example. Then, that pixel units are formed in the pixel region may include: a gate electrode, a gate insulating layer, an active layer, a source-drain electrode layer, a passivation layer, and a pixel electrode are sequentially formed in the pixel region; the source-drain electrode layer includes a source electrode and a drain electrode, which are in contact with the active layer respectively; a via hole is formed in the passivation layer, and the pixel electrode is in contact with the drain electrode through the via hole.

Optionally, when the display panel is a liquid crystal display panel, each pixel unit formed in the pixel region may further include a common electrode, liquid crystals, and the like which are formed in the pixel region; and when the display panel is an electroluminescence display panel, each pixel unit formed in the pixel region may further include an electroluminescent layer, a cathode, and the like which are formed in the pixel region, which will not repeated in the embodiment of the present disclosure.

In Step 105, the protective substrate is disposed opposite to the base substrate, such that the light-shielding layer is located between the base substrate and the protective substrate.

A schematic diagram after the protective substrate 105 is disposed opposite to the base substrate 101 may refer to FIG. 6. The protective substrate 105 may be disposed opposite to the base substrate 101 by a bonding process. Optionally, a frame sealant may be applied to a peripheral region of one side, where the light-shielding layer 102 is provided, of the base substrate 101. Then, the protective substrate 105 is disposed on one side of the base substrate 101 having the light-shielding layer 102. In addition, a pressure is applied to the base substrate 101 and the protective substrate 105, such that the protective substrate 105 is disposed opposite to the base substrate 101, and then the frame sealant is cured to obtain a display panel 10.

In the embodiment of the present disclosure, the single patterning process includes: photoresist coating, exposure, development, etching, and photoresist stripping. Therefore, processing a material layer (e.g., the metal material layer) by the single patterning process may include: coating the material layer with a layer of photoresist to form a photoresist layer; exposing the photoresist layer with a mask, to form a fully exposed region and a non-exposed region on the photoresist layer; then performing a development process to completely remove the photoresist in the fully exposed region, and retaining all the photoresist in the non-exposed region; and etching a region corresponding to the completely exposed region on the material layer by an etching process, and then stripping the photoresist in the non-exposed region, such that the region corresponding to the non-exposed region on the material layer forms a corresponding structure (for example, the light-shielding structure 1021). It is easily understood that the photoresist mentioned in the process of describing the single patterning process in this paragraph is positive photoresist. This photoresist may also be negative photoresist. When the photoresist is the negative photoresist, the procedure of the single patterning process may refer to the description in this paragraph, and will not be described again in this embodiment of the present disclosure.

The steps of the manufacturing method of the display panel as provided by the embodiment of the present disclosure may be appropriately adjusted, or increased or decreased according to situations. Any method that can be easily conceived by a person skilled in the art within the technical scope of the present disclosure is intended to be included in the protection scope of the present disclosure and therefore will not be described again.

In summary, according to the manufacturing method of the display panel as provided by the embodiment of the present disclosure, the light-shielding layer and a plurality of wires are arranged on the base substrate in the display panel, and includes a plurality of light-shielding structures, and the orthographic projections of at least two of the plurality of wires on the base substrate are located within the orthographic projection of one light-shielding structure on the base substrate. Therefore, the light-shielding structures can shield the external light which is emitted to at least two wires through the base substrate, and reduce the diffraction of the external light among the wires, thereby reducing the influence of the external light on the display effect of the display panel.

Based on the same inventive concept, an embodiment of the present disclosure further provides a display device including the display panel 10 shown in any of FIGS. 4 to 6. The display device may be a mobile terminal such as a mobile phone or a tablet computer. Alternatively, the display device may be any product or component having a display function such as a television, a display, a notebook computer, a digital photo frame or a navigator.

Optionally, the display device is a mobile terminal. The mobile terminal generally includes a camera. The display panel 10 has a transparent display region and a non-transparent display region. The camera is located on the non-display side of the display panel 10, and an orthographic projection of the camera on the display panel 10 is located in the transparent display region of the display panel 10.

In the embodiment of the present disclosure, both the transparent display region and the non-transparent display region of the display panel 10 can display images, and the camera is located on the non-display side of the display panel 10. Therefore, the area of the display region of the display panel 10 may be equal to the area of the front surface of the mobile terminal, and thus, the mobile terminal can achieve a full screen display. In addition, as shown in FIG. 4 to FIG. 6, the light-shielding layer 102 is disposed in the display panel 10. The light-shielding structure 1021 of the light-shielding layer 102 can shield external light which is emitted to at least two wires 103 through the base substrate 101 to reduce the diffraction of the external light among the pixel wires 103 of the display panel 10, thereby reducing the influence of the external light on the display effect of the display panel 10, and also reducing the influence of the external light on photographing light of the camera. The mobile terminal provided by the embodiment of the present disclosure has a better full-screen display effect.

The foregoing descriptions are merely exemplary embodiments of the present disclosure, and are not intended to limit the present disclosure. Within the spirit and principles of the present disclosure; any modifications, equivalent substitutions; improvements, etc., are within the protection scope of the present disclosure.

The invention claimed is:

1. A display panel, comprising:
a base substrate, and a light-shielding layer and a plurality of wires which are sequentially located on the base substrate in a direction away from the base substrate, wherein
the light-shielding layer comprises a plurality of light-shielding structures; the display panel has a transparent display region; orthographic projections of at least two wires located on the transparent display region on the base substrate are located within an orthographic projection of one light-shielding structure on the base substrate; and the one light-shielding structure is configured to shield external light which is emitted to the at least two wires through the base substrate; and
wherein a ratio of a width of the first light-shielding structure to a first spacing is less than 7.5/16.125, and a sum of the width of the first light-shielding structure and the first spacing is greater than 94.5 microns; the first light-shielding structure is any one of the plurality of light-shielding structures; the first spacing is a distance between the second light-shielding structure and the first light-shielding structure; and the second light-shielding structure is adjacent to the first light-shielding structure.

2. The display panel according to claim 1, wherein the ratio of the width of the first light-shielding structure to the first spacing is 7/16, and the sum of the width of the first light-shielding structure and the first spacing is 115 microns.

3. The display panel according to claim 1, wherein orthographic projections of the plurality of wires on the base substrate are located within orthographic projections of the plurality of light-shielding structures on the base substrate.

4. The display panel according to claim 1, wherein the display panel is a partially transparent display panel.

5. The display panel according to claim 1, wherein the display panel further comprises a protective layer located between the light-shielding layer and the plurality of wires.

6. The display panel according to claim 1, wherein a material of the light-shielding layer comprises metal.

7. The display panel according to claim 1, wherein the display panel further comprises a protective substrate distributed opposite to the base substrate, and the light-shielding layer is located between the base substrate and the protective substrate.

8. The display panel according to claim 1, wherein the display panel comprises a plurality of pixel regions, and wires are arranged between at least two adjacent pixel regions; the pixel region is provided with a pixel unit; the pixel unit comprises a gate electrode, a gate insulating layer, an active layer, a source electrode, a drain electrode, a passivation layer and a pixel electrode, wherein the source electrode and the drain electrode are in contact with the active layer respectively, and the pixel electrode is in contact with the drain electrode.

9. The display panel according to claim 1, wherein the one light-shielding structure and the at least two wires are identical in shape and extending direction.

10. The display panel according to claim 1, wherein the display panel is a full-screen transparent display panel.

11. The display panel according to claim 1, wherein,
the display panel is a partially transparent display panel, the display panel comprises a plurality of pixel regions, and wires are arranged between at least two adjacent pixel regions; the pixel region is provided with a pixel unit; the pixel unit comprises a gate electrode, a gate insulating layer, an active layer, a source electrode, a drain electrode, a passivation layer and a pixel electrode, wherein the source electrode and the drain electrode are in contact with the active layer respectively, and the pixel electrode is in contact with the drain electrode;
orthographic projections of the plurality of wires on the base substrate are located within orthographic projections of the plurality of light-shielding structures on the base substrate, the one light-shielding structure and the at least two wires are identical in shape and extending direction, a ratio of a width of the first light-shielding structure to the first spacing is 7/16, a sum of the width of the first light-shielding structure and the first spacing is 115 microns, the first light-shielding structure is any one of the plurality of light-shielding structures, the first spacing is a distance between the second light-shielding structure and the first light-shielding structure and the second light-shielding structure is adjacent to the first light-shielding structure; and
the display panel further comprises: a protective layer located between the light-shielding layer and the plurality of wires and a protective substrate distributed opposite to the base substrate, the light-shielding layer is located between the base substrate and the protective substrate, and a material of the light-shielding layer comprises metal.

12. The method according to claim 11, wherein the ratio of the width of the first light-shielding structure to the first spacing is 7/16, and the sum of the width of the first light-shielding structure and the first spacing is 115 microns.

13. A manufacturing method of a display panel, comprising the following steps:
forming a light-shielding layer on a base substrate, the light-shielding layer comprising a plurality of light-shielding structures; and
forming a plurality of wires on the base substrate on which the light-shielding layer is formed, wherein
the display panel has a transparent display region; orthographic projections of at least two wires located on the transparent display region on the base substrate are located within an orthographic projection of one light-shielding structure on the base substrate; and the one light-shielding structure is configured to shield external light which is emitted to the at least two wires through the base substrate; and
wherein a ratio of a width of the first light-shielding structure to a first spacing is less than 7.5/16.125, and a sum of the width of the first light-shielding structure and the first spacing is greater than 94.5 microns; the first light-shielding structure is any one of the plurality of light-shielding structures; the first spacing is a distance between the second light-shielding structure and the first light-shielding structure; and the second light-shielding structure is adjacent to the first light-shielding structure.

14. The method according to claim 13, after forming the light-shielding layer on the base substrate, further comprising: forming a protective layer on the base substrate on which the light-shielding layer is formed, wherein
the forming a plurality of wires on the base substrate on which the light-shielding layer is formed comprises: forming a plurality of wires on the base substrate on which the protective layer is formed.

15. The method according to claim 13, wherein the forming a light-shielding layer on a base substrate comprises: forming a light-shielding layer on the base substrate by using metal.

16. The method according to claim 13, wherein the method further comprises: arranging the protective substrate opposite to the base substrate, the light-shielding layer being located between the base substrate and the protective substrate.

17. A display device, comprising a display panel, wherein the display panel comprises a base substrate, and a light-shielding layer and a plurality of wires which are sequentially located on the base substrate in a direction away from the base substrate; and
wherein the light-shielding layer comprises a plurality of light-shielding structures; the display panel has a transparent display region; orthographic projections of at least two wires located on the transparent display region on the base substrate are located within an orthographic projection of one light-shielding structure on the base substrate; and the one light-shielding structure is configured to shield external light which is emitted to the at least two wires through the base substrate; and
wherein a ratio of a width of the first light-shielding structure to a first spacing is less than 7.5/16.125, and a sum of the width of the first light-shielding structure and the first spacing is greater than 94.5 microns; the first light-shielding structure is any one of the plurality of light-shielding structures; the first spacing is a distance between the second light-shielding structure and the first light-shielding structure; and the second light-shielding structure is adjacent to the first light-shielding structure.

18. The display device according to claim 17, wherein the display device is a mobile terminal which comprises a camera; the display panel has a transparent display region and a non-transparent display region; the camera is located on a non-display side of the display panel; and an orthographic projection of the camera on the display panel is located in the transparent display region.

* * * * *